(12) United States Patent
Kang

(10) Patent No.: US 6,751,148 B2
(45) Date of Patent: Jun. 15, 2004

(54) CIRCUIT FOR GENERATING CONTROL SIGNAL USING MAKE-LINK TYPE FUSE

(75) Inventor: Sang-seok Kang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 46 days.

(21) Appl. No.: 10/114,523

(22) Filed: Apr. 2, 2002

(65) Prior Publication Data

US 2002/0196694 A1 Dec. 26, 2002

(30) Foreign Application Priority Data

Jun. 26, 2001 (KR) ........................................ 2001-36585

(51) Int. Cl.[7] ................................................. G11C 7/00
(52) U.S. Cl. ................ 365/225.7; 365/205; 365/230.06
(58) Field of Search ............................. 365/225.7, 205, 365/230.06

(56) References Cited

U.S. PATENT DOCUMENTS 6,141,282 A * 10/2000 Chin et al. ................ 365/225.7
6,320,802 B1 * 11/2001 Ohbayashi .................. 365/200
6,345,003 B1 * 2/2002 Choi .......................... 365/200
6,477,102 B1 * 11/2002 Matsui ..................... 365/225.7

* cited by examiner

Primary Examiner—Michael S. Lebentritt
Assistant Examiner—Toan Le
(74) Attorney, Agent, or Firm—F. Chau & Associates, LLC

(57) ABSTRACT

A control signal generating circuit including a make-link type fuse is provided. The circuit includes a first transistor for receiving an input signal at a gate thereof, the first transistor being connected to a first voltage, a second transistor for receiving the input signal at a gate thereof, the second transistor being connected to a second voltage, a make-link type fuse serially linked between the first and second transistors by application of energy, and a sensing circuit, connected to the make-link type fuse, for sensing whether the make-link type fuse is linked between the first and second transistors or not and for outputting a control signal based on the sensed result and the input signal. The first and second transistors are complementarily connected to turn on one of the first and second transistors in response to the input signal, thereby preventing current from flowing between the first and second transistors when the make-link type fuse is linked between the first and second transistors.

11 Claims, 8 Drawing Sheets

CIRCUIT FOR GENERATING CONTROL SIGNAL USING MAKE-LINK TYPE FUSE

CROSS-REFERENCE TO RELATED APPLICATION

This application claims priority to Korean Patent Application No. 2001-36585 filed on Jun. 26, 2001.

BACKGROUND OF THE INVENTION

1. Technical Field

The present invention relates to a semiconductor memory device, and more particularly, to a control signal generating circuit suitable for a programmable mode selector using a fuse.

2. Description of Related Art

Semiconductor memory devices comprise programmable mode selectors that are used to select various operational modes including tests and repairs.

FIG. 1 is a circuit diagram of a conventional control signal generating circuit used for a programmable mode selector. Referring to FIG. 1, a conventional control signal generating circuit 100 comprises a resistance R11 connected to a power supply voltage VCC, a break-link type fuse BL, an NMOS transistor MN11, an inverter I11 linked to a node between the break-link type fuse BL and the NMOS transistor MN11, an NMOS transistor MN12, and a ground voltage VSS.

The break-link type fuse BL is an electrical fuse which can break a connection by over-current or a laser fuse cut by a laser beam. A control signal (MODESEL) is generated to select various operational modes when the break-link type fuse BL is cut and the NMOS transistor MN11 is turned on by an input signal (IN). The break-link type fuse BL is usually not break a connection when a small amount of current flows through the break-link type fuse BL, because the fuse is lined with a conductor.

Different from a break-link type fuse, a make-link type fuse makes a connection (that is, the make-link type fuse is linked) by application of energy such as a laser beam or a surge of current. The make-link type fuse has a configuration which is simpler than the configuration of the break-link type fuse, thereby increasing the integration density of a semiconductor memory device.

A problem with a make-link type fuse is when a make-link type fuse is installed in a control signal generating circuit instead of a break-link type fuse, the make-link type fuse can unintentively make a connection by electro-migration, even from a small amount of current flowing through the make-link type fuse. Accordingly, the control signal generating circuit having a make-link type fuse is less reliable.

A need therefore exists for a control signal generating circuit having a make-link type fuse which is stable and reliable in current flowing through the make-link type fuse.

SUMMARY OF THE INVENTION

It is an object of the present invention to provide a control signal generating circuit that inhibits current flowing through a make-link type fuse, thereby improving the stability and reliability of operation.

According to one aspect of the present invention, there is provided a circuit for generating a control signal. The circuit comprises a first transistor for receiving an input signal at a gate thereof, the first transistor being connected to a first voltage, a second transistor for receiving the input signal at a gate thereof, the second transistor being connected to a second voltage, a make-link type fuse serially linked between the first and second transistors by application of energy, and a sensing circuit, connected to the make-link type fuse, for sensing whether the make-link type fuse is linked or not and for outputting a control signal based on the sensed result and the input signal. The first and second transistors are complementarily connected to turn on one of the first and second transistors in response to the input signal, thereby preventing current from flowing between the first and second transistors when the make-link type fuse is linked between the first and second transistors.

In an embodiment of the present invention, the sensing circuit preferably comprises a first inverter connected to a node connecting to the make-link type fuse, a third transistor having a gate and first and second ends, and a second inverter, connected to the first inverter, for outputting the control signal. In the third transistor, the gate receives an output signal of the first inverter, the first end is connected to the node and the second end is connected to the first voltage.

According to another aspect of the present invention, there is provided a circuit for generating a control signal. The circuit comprises a first transistor for receiving an input signal at a gate thereof, the first transistor being connected to a first voltage, a current limiter connected to a second voltage, a make-link type fuse serially linked between the first transistor and the current limiter, and a sensing circuit, connected to the make-link type fuse, for sensing whether the make-link type fuse is linked or not and for outputting a control signal based on the sensed result and the input signal.

According to further aspect of the present invention, there is provided a semiconductor device comprising a control signal generating circuit. The control signal generating circuit of the semiconductor device comprises a first transistor for receiving an input signal at a gate thereof, the first transistor being connected to a first voltage, a second transistor for receiving the input signal at a gate thereof, the second transistor being connected to a second voltage, a make-link type fuse serially linked between the first and second transistors, and a sensing circuit, connected to the make-link type fuse, for sensing whether the make-link type fuse is linked or not and for outputting a control signal based on the sensed result and the input signal. In an embodiment of the present invention, the control signal selects an operation mode of the semiconductor device. The first and second transistors are complementarily connected to turn on one of the first and second transistors in response to the input signal, thereby preventing current from flowing between the first and second transistors when the make-link type fuse is linked between the first and second transistors.

Advantageously, a control signal generating circuit according to an embodiment of the present invention inhibits current from flowing through a make-link type fuse to prevent unintentively making a connection. Thus, a semiconductor device comprising the control signal generating circuit can perform a stable and reliable operation. Further, since the control signal generating circuit can be configured in various ways and to realize a narrow fuse pitch, it is possible to increase the integration density of a semiconductor device.

BRIEF DESCRIPTION OF THE DRAWINGS

The above objects, aspects and advantages of the present invention will become more apparent by describing in detail preferred embodiments thereof with reference to the attached drawings in which.

DETAILED DESCRIPTION OF PREFERRED EMBODIMENTS

Figure 1:
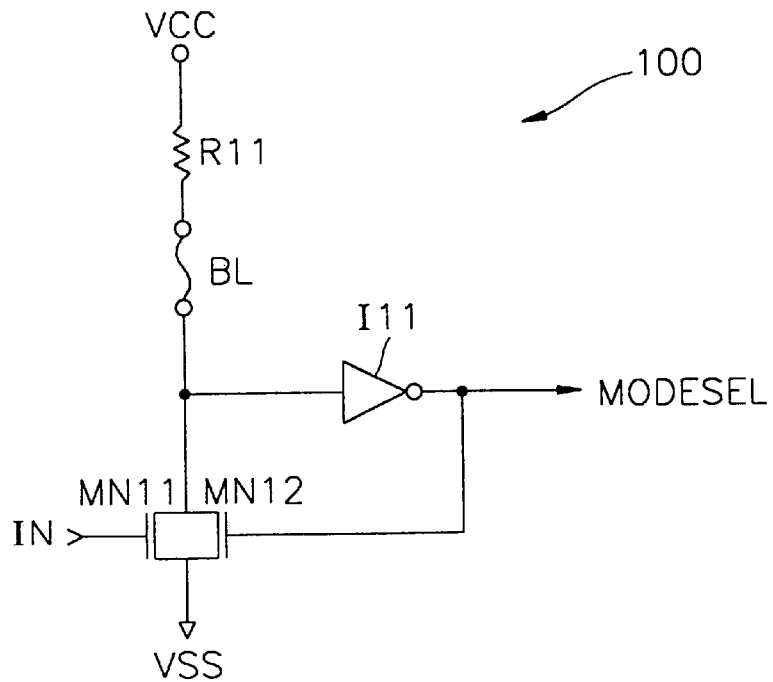
FIG. 1 is a circuit diagram of a conventional control signal generating circuit used for a programmable mode selector.

Hereinafter, the present invention will be described in detail by explaining preferred embodiments thereof with reference to the attached drawings. Like reference numerals in the drawings denote elements having the same or similar functions.

As described above, a make-link type fuse is initially cut (unlinked) and later makes a connection (linked) by a laser beam, preferably generated from an external apparatus. Since a make-link type fuse is typically formed of a metal such as aluminum, the make-link type fuse can easily make a connection due to electro-migration generated by current flowing through the make-link type fuse. Therefore, it is important for a circuit using a make-link type fuse to reduce the amount of current flowing through the make-link type fuse. According to an embodiment of the present invention, a control signal generating circuit reduces the amount of current flowing through a make-link type fuse.

Figure 2:
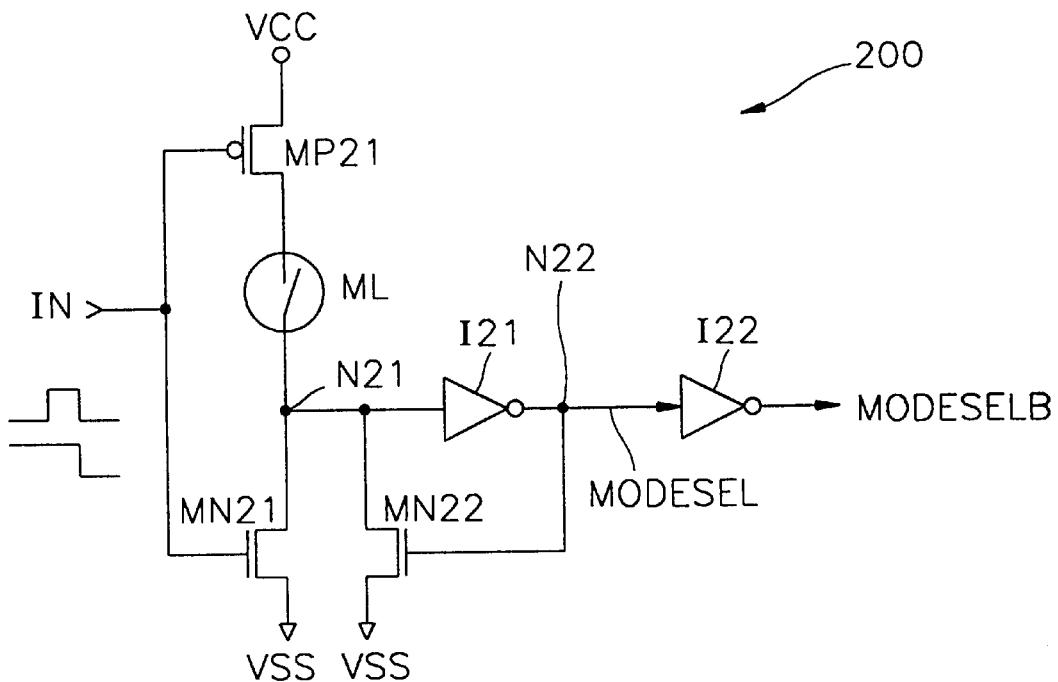
FIG. 2 is a circuit diagram of a control signal generating circuit according to a first embodiment of the present invention.

Referring to FIG. 2, a control signal generating circuit 200 according to a first embodiment of the present invention comprises a first PMOS transistor MP 21, a first NMOS transistor MN 21, a make-link type fuse ML, a first inverter I21, a second NMOS transistor MN22, and a second inverter I22.

The first PMOS transistor MP 21 is gated by an input signal (IN) and is connected to a first voltage VCC. The first NMOS transistor MN 21 is gated by the input signal (IN) and is connected to a second voltage VSS. The first PMOS transistor MP 21 and the first NMOS transistor MN 21 are complementarily connected to turn on one of the first PMOS transistor MP21 and the first NMOS transistor MN21 in response to the input signal (IN). The first voltage VCC may be a power voltage and the second voltage VSS may be a ground voltage. The make-link type fuse ML serially connects the first PMOS transistor MP 21 and the first NMOS transistor MN 21 by a laser beam from an external apparatus. For example, when a laser beam is applied to the make-link type fuse ML, the make-link type fuse ML is linked (linked state) between the first PMOS transistor MP21 and the first NMOS transistor MN21, thereby connecting the first PMOS transistor MP 21 and the first NMOS transistor MN 21. When there is no application of the laser beam, the make-link type fuse ML is unlinked (unlinked state) between the first PMOS transistor MP21 and the first NMOS transistor MN21, thereby disconnecting two transistors MP21 and MN21.

The first inverter I21 is connected to the make-link type fuse ML. The second NMOS transistor MN 22 has a gate and first and second ends. The gate receives a signal output from the first inverter I21, the first end is connected to the first node N21 connecting to the make-link type fuse ML and the second end is connected to the second voltage VSS. The first inverter I21 outputs a control signal (MODESEL). The second inverter I22 inverts the control signal (MODESEL) to output an inverted control signal (MODESELB).

The input signal (IN) is preferably generated by sensing the power-up of a power voltage supplied to a semiconductor memory device, or generated in response to a signal applied to an external input pin. The input signal (IN) may be an input auto pulse having one clock cycle or a signal transiting from a logic "high" to a logic "low".

The control signal generating circuit controls a logic level of the inverted control signal (MODESELB) according to an initial state (linked or unlinked state) of the make-link type fuse ML and a logic level of the input signal (IN).

First, assume that when the make-link type fuse ML is unlinked state, the signal (IN) having logic "low" is input. At this time, the first NMOS transistor MN 21 is turned off, the make-link type fuse ML is cut off from VSS, and the first node N21, connected to the make-link type fuse ML is floated. Thus, when the input signal (IN) is logic "low", the state of the make-link type fuse ML is not sensed and the control signal generating circuit does not generate a control signal.

When the input signal (IN) goes to logic "high" at the unlinked state of the make-link type fuse ML, the first NMOS transistor MN 21 is turned on, pulling down the first node N21 to VSS or logic "low". Node N22, connected to the output of the first inverter I21, is logic "high", turning on the second NMOS transistor MN22, the inverted control signal (MODESELB) through the second inverter I22 is logic "low". Thereafter, even if the input signal (IN) becomes logic "low" again, the inverted control signal (MODESELB) remains at logic "low" due to the turn-on of the second NMOS transistor MN22, maintaining the first node N21 at logic "low".

Next, assume that when the make-link type fuse ML is linked state, the signal (IN) having logic "low" is input. At this time, the first PMOS transistor MP 21 is turned on and the first NMOS transistor MN21 is turned off. Because the make-link type fuse ML is linked to the first PMOS transistors MP21, which in turn is connected to a power supply voltage VCC, the first node N21 is logic "high" and the second node N22 through the first inverter I21 is logic "low", thereby the inverted control signal (MODESELB) is at logic "high". Whether the make-link type fuse is linked or not between the first PMOS transistor MP21 and the first NMOS transistor MN21 is sensed in response to the input signal (IN) having the logic "low".

When the signal (IN) having logic "high" is input at the linked state of the make-link type fuse ML, the first NMOS transistor MN21 is turned on and the first PMOS transistor MP21 is turned off. Because the make-link type fuse ML is linked to the first NMOS transistor connecting to a ground voltage VSS, the first node N21 is logic "low", the second node N22 is logic "high", the second NMOS transistor MN22 is turned on, and the inverted control signal (MODESELB) is logic "low". Here, since the first PMOS transistor MP21 is turned off, the make-link type fuse ML is cut off from VCC and no current flows through the make-link type fuse ML.

Thereafter, if the input signal (IN) becomes logic "low" again, the first PMOS transistor MP21 is turned on and the first NMOS transistor MN21 is turned off. Because the make-link type fuse ML is connected to the first PMOS transistor MP21, which in turn is connected to VSS, the first node N21 is logic "high" and the second node N22 is logic "low", thereby the inverted control signal (MODESELB) is at logic "high". Here, since the first and second NMOS transistors MN21 and MN22 are turned off, there is no flow of current through the make-link type fuse ML and either transistor MN 21 or MN 22 to VSS.

As described above, the inverted control signal (MODESELB) is logic "low" regardless of a logic level of the input signal (IN) when the make-link type fuse ML is unlinked, while the logic level of the signal (MODESELB) depends on the logic level of the input signal (IN) when the make-link type fuse ML is linked. Thus, whether the make-link type fuse ML is linked or not may be sensed by using the logic level of the inverted control signal (MODESELB). Further, since the first PMOS transistor MP21 and the first NMOS transistor MN21 is complementarily turned on or off in response to the input signal, current flowing through the make-link type fuse ML can preferably be prevented. Therefore, the control signal generating circuit 200 performs stable and reliable operations.

Figure 3:
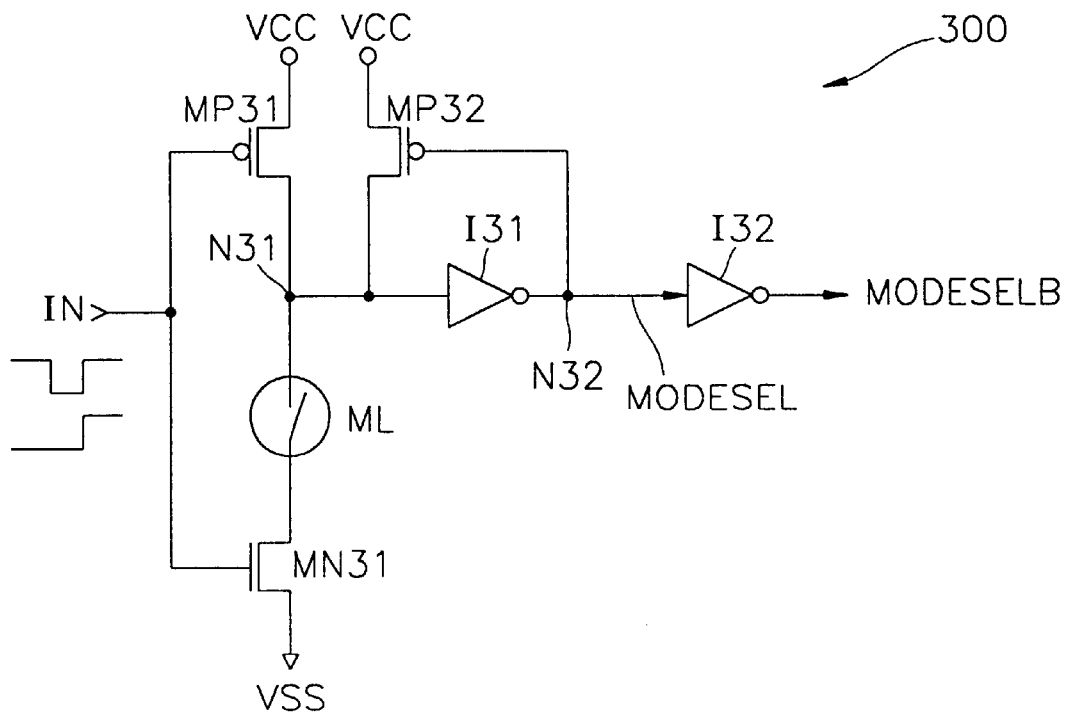
FIG. 3 is a circuit diagram of a control signal generating circuit according to a second embodiment of the present invention.

Referring to FIG. 3, a control signal generating circuit 300 according to a second embodiment of the present invention comprises a first PMOS transistor MP31, a first NMOS transistor MN31, a make-link type fuse ML, a first inverter I31, a second PMOS transistor MP32, and a second inverter I32.

The first PMOS transistor MP31 is gated by an input signal (IN) and is connected to a first voltage VCC. The first NMOS transistor MN31 is gated by the input signal (IN) and is connected to a second voltage VSS. The first PMOS transistor MP31 and the first NMOS transistor MN31 are complementary, i.e., when one is turned on, the other is turned off in response to the input signal (IN). Here, the first voltage VCC may be a power voltage and the second voltage VSS may be a ground voltage. The make-link type fuse ML is, in series, linked between the first PMOS transistor MP31 and the first NMOS transistor MN31 by a laser beam generated from an external apparatus.

The first inverter I31 is connected to the make-link type fuse ML. The second PMOS transistor MP32 has a gate and first and second ends. The gate receives a signal output from the first inverter I31, the first end is connected to a first node N31 connecting to the make-link type fuse ML and the second end is connected to the first voltage VCC. The first inverter I31 outputs a control signal (MODESEL), and the second inverter I32 inverts the control signal (MODESEL) to output an inverted control signal (MODESELB).

The input signal (IN) may be an input auto pulse having one clock cycle or a signal transiting from logic "low" to "high".

The operation of the control signal generating circuit 300 in FIG. 3 is similar to the operation of the control signal generating circuit 200 in FIG. 2, and thus a detailed description thereof will be omitted. Similar to the control signal generating circuit 200 in FIG. 2, the control signal generating circuit 300 in FIG. 3 inhibits current from flowing through the make-link type fuse ML, thereby prohibiting the make-link type fuse ML from unintentively making a connection due to the current flowing through the fuse. Thus, the control signal generating circuit 300 can perform reliable and stable operations.

Figure 4:
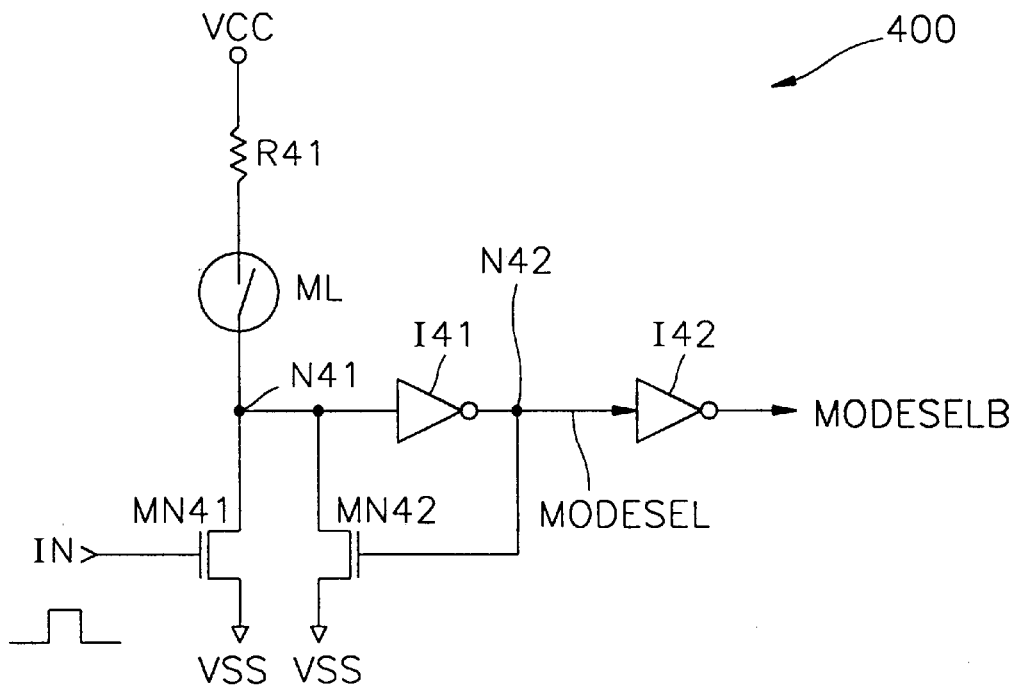
FIG. 4 is a circuit diagram of a control signal generating circuit according to a third embodiment of the present invention.

Referring to FIG. 4, a control signal generating circuit 400 according to a third embodiment of the present invention comprises a current limiter R41, a first NMOS transistor MN41, a make-link type fuse ML, a first inverter I41, a second NMOS transistor MN42, and a second inverter I42.

The current limiter R41 is connected to a first voltage VCC, and the first NMOS transistor MN41 is gated by an input signal (IN) and is connected to a second voltage VSS. The current limiter R41 may be a resistor or a MOS transistor. The first voltage VCC may be a power voltage and the second voltage VSS may be a ground voltage.

The make-link type fuse ML is, in series, linked between the current limiter R41 and the first NMOS transistor MN41 by a laser beam generated from an external apparatus.

The first inverter I41 is connected to the make-link type fuse ML. The second NMOS transistor MN42 has a gate and first and second transistors. The gate receives a signal output from the inverter I41, the first end is connected to a first node N41 connected to the make-link type fuse, and the second end is connected to the second voltage VSS. The first inverter I41 outputs a control signal (MODESEL), and the second inverter I42 inverts the control signal (MODESEL) to output an inverted control signal (MODESELB).

In the control signal generating circuit 400, the input signal (IN) is preferably an auto pulse having one clock cycle. The control signal generating circuit 400 in FIG. 4 is different form the control signal generating circuit 200 in FIG. 2 in that the limiter R41 inhibits current from flowing through the make-link type fuse ML instead of the first PMOS transistor MP 21 gated by the input signal (IN). The limiter R41 may be a resistor or a MOS transistor that allows a small amount of current to flow through the make-link type fuse ML. Thus, the limiter R41 limits current from flowing through the make-link type fuse ML to prevent the make-link type fuse ML from unintentively making a connection, thereby improving the stability and reliability of the control signal generating circuit 400. The operation of the control signal generating circuit 400 in FIG. 4 is similar to the operation of the control signal generating circuit 200 in FIG. 2, and thus a detailed description will be omitted.

Figure 5:
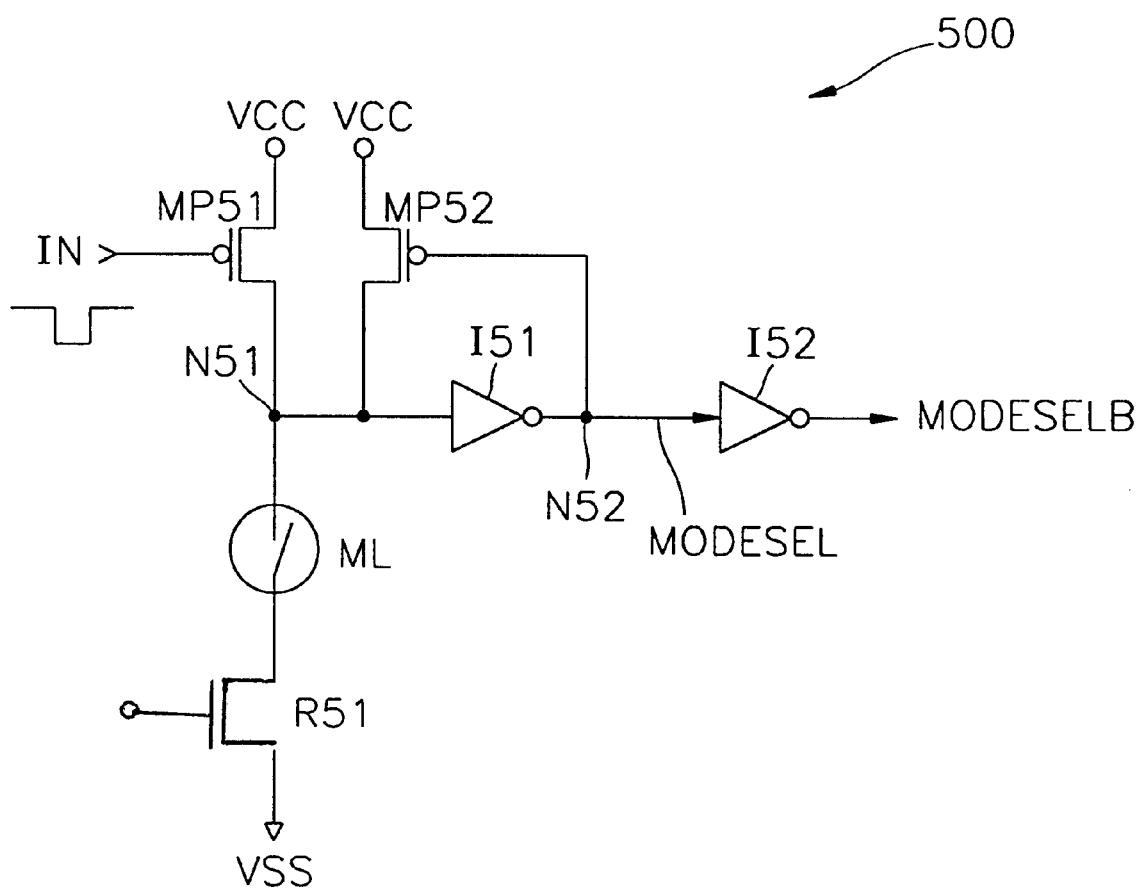
FIG. 5 is a circuit diagram of a control signal generating circuit according to a fourth embodiment of the present invention.

Referring to FIG. 5, a control signal generating circuit 500 according to a fourth embodiment of the present invention comprises a first PMOS transistor MP51, a current limiter R51, a make-link type fuse ML, a first inverter I51, a second PMOS transistor MP52, and a second inverter I52.

The first PMOS transistor MP51 is gated by an input signal (IN) and is connected to a first voltage VCC, and the current limiter R51 is connected to a second voltage VSS.

The current limiter R51 may be a resistor or a MOS transistor. The first voltage VCC may be a power voltage and the second voltage VSS may be a ground voltage. The make-link type fuse ML is, in series, linked between the current limiter R51 and the first PMOS transistor MP51 by a laser beam generated from an external apparatus.

The first inverter I51 is connected to the make-link type fuse ML. The second PMOS transistor MP 52 has a gate and first and second ends. The gate receives a signal output from the first inverter I51, the first end is connected to the first node N51 connecting to the make-link type fuse ML, and the second end is connected to the first voltage VCC. The first inverter I51 outputs a control signal (MODESEL), and the second inverter I52 inverts the control signal (MODESEL) to output an inverted control signal (MODESELB).

In the fourth embodiment according to the present invention, the input signal (IN) is preferably an auto pulse having one clock cycle. The operation of the control signal generating circuit 500 in FIG. 5 is similar to the operation of the control signal generating circuit 400 in FIG. 4, and thus a detailed description thereof will be omitted.

In the control signal generating circuit 500, the current limiter R51 limits current flowing through the make-link type fuse ML to prevent the make-link type fuse ML from unintentively making a connection, thereby improving the stability and reliability of the control signal generating circuit 500.

Figure 6A:
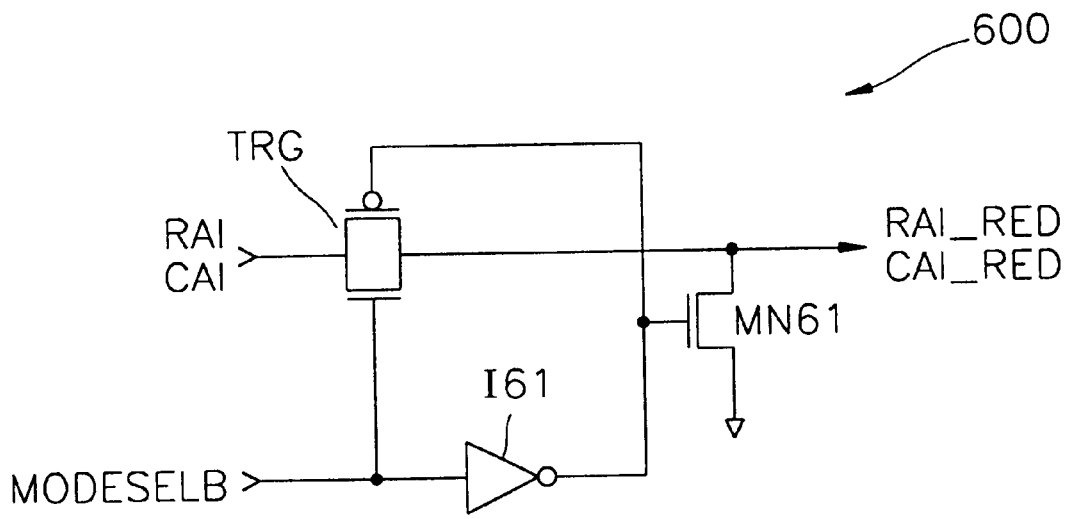
FIGS. 6A and 6B are circuit diagrams of exemplary redundancy cell control circuits comprising a control signal generating circuit according to the present invention.
Figure 6B:
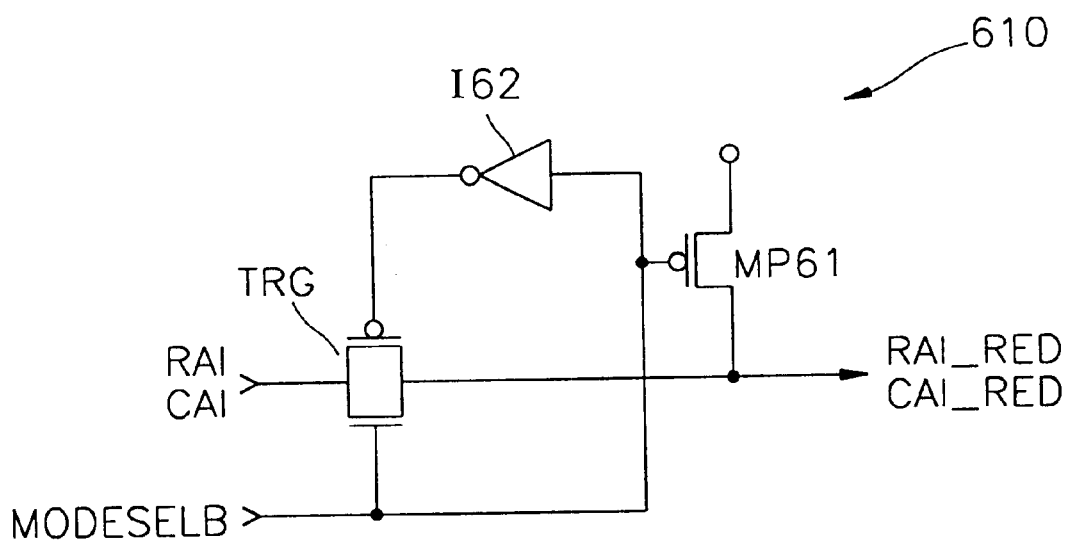

FIGS. 6A and 6B show exemplary redundancy cell control circuits comprising one of control signal generating circuits 200, 300, 400 and 500 according to the present invention, respectively. Referring to FIGS. 6A and 6B, an inverted control signal (MODESELB) output from a control signal generating circuit (200, 300, 400, or 500) according to an embodiment of the present invention controls a row address signal (RAI) or a column address signal (CAI). The row address signal (RAI) and column address signal (CAI) respectively become final output signals (RAI-RED and CAI-RED) for controlling operations of the redundancy cell control circuits 600 and 610.

It is assumed that the redundancy cell control circuits 600 and 610 do not activate a redundancy cell if the final output signals (RAI-RED and CAI-RED) are logic "low".

For instance, when the redundancy cell control circuit 600 does not repair a defective cell, the control signal generating circuit 200, 300, 400 or 500 generates the inverted control signal (MODESELB) having a logic "high". In response to the logic level of the inverted control signal (MODESELB), a transmission gate TRG is turned on and an NMOS transistor MN 61 is turned off, thereby outputting the final output signals (RAI-RED and CAI-RED) having a logic "low". Accordingly, the redundancy cell control unit 600 does not activate a redundancy cell for repairing a detective cell.

On the contrary, the redundancy cell control circuit 610 in FIG. 6B does not repair a defective cell when the final output signals (RAI-RED and CAI-RED) are logic "high". The operation of the redundancy cell control circuit 610 in FIG. 6B is similar to the operation of the redundancy cell control circuit 600 in FIG. 6A, and thus a detailed description thereof will be omitted.

Figure 7:
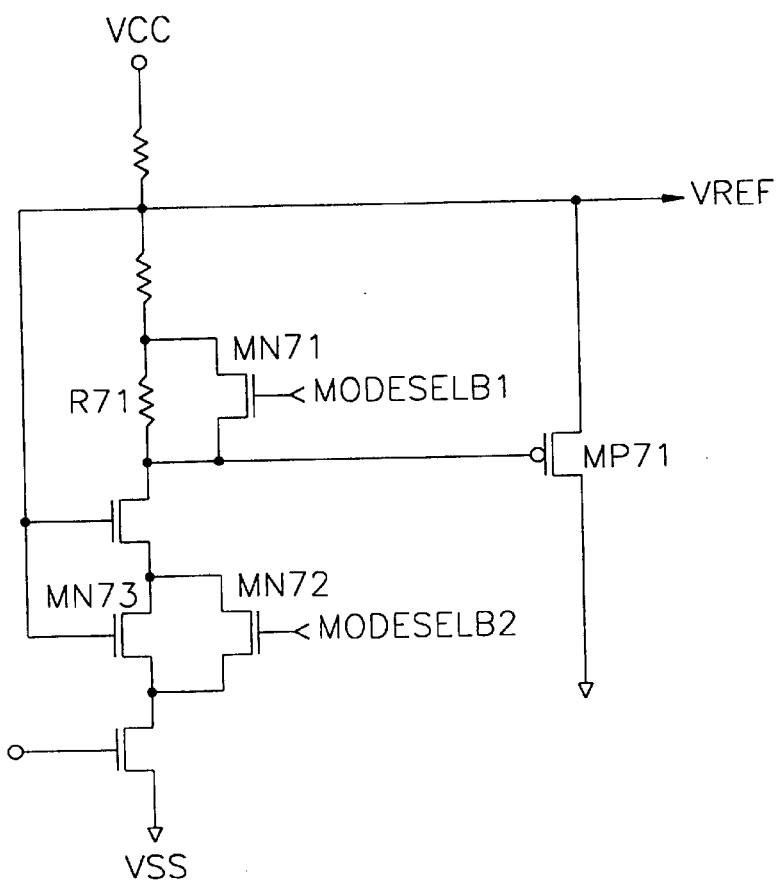
FIG. 7 is a circuit diagram of a reference voltage variable circuit comprising a control signal generating circuit according to the present invention.

FIG. 7 shows a reference voltage variable circuit comprising a control signal generating circuit according to an embodiment of the present invention. Referring to FIG. 7, first and second inverted control signals (MODESELB 1 and MODESELB 2) respectively indicate the signals output from the control signal generating circuits 200, 300, 400, or 500 according to the first through fourth embodiments.

The reference voltage variable circuit controls a reference voltage VREF in response to logic levels of the first and second inverted control signals (MODESELB 1 and MODESELB 2). For instance, the reference voltage variable circuit increases the reference voltage VREF in response to the logic "high" of the first converted control signal (MODESELB 1), in which an NMOS transistor MN 71 is turned on and a resistance R71 is bypassed. Further, the reference voltage variable circuit decreases the reference voltage VREF in response to the logic "high" of the second inverted control signal (MODESELB 2), in which an NMOS transistor 72 is turned on and a resistance of an NMOS transistor 73 is bypassed.

Figure 8:
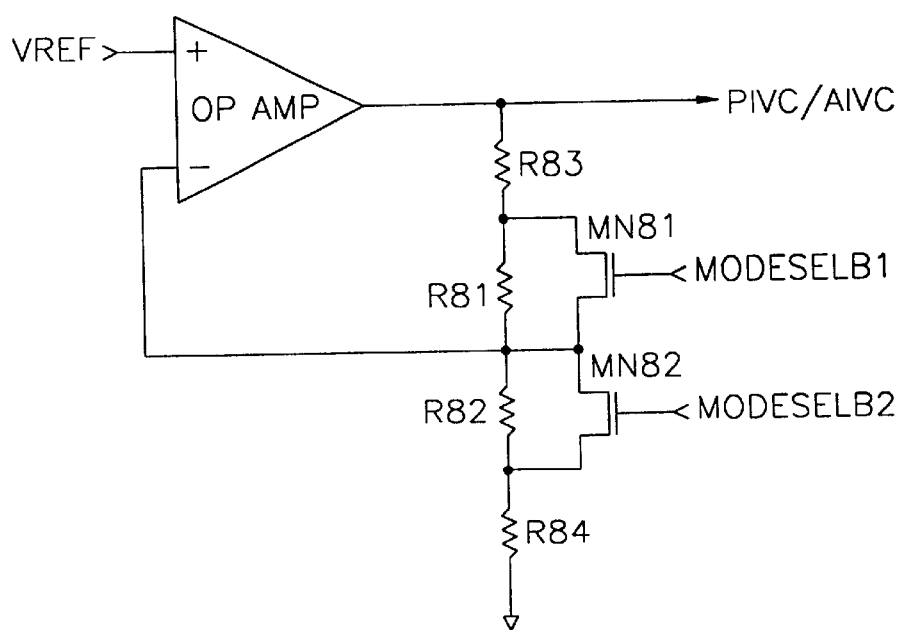
FIG. 8 is a circuit diagram of an internal power voltage variable circuit comprising a control signal generating circuit according to the present invention.

FIG. 8 shows an internal power voltage variable circuit comprising a control signal generating circuit according to an embodiment of the present invention. Referring to FIG. 8, the internal power voltage variable circuit controls a level of an internal power voltage PIVC/AIVC (that is divided into a cell array power voltage AIVC and a periphery power voltage PIVC), in response to logic levels of first and second inverted control signals (MODESELB 1 and MODESELB 2) output from the control signal generating circuit 200, 300, 400 or 500.

For instance, the internal power voltage variable circuit increases the level of the internal power voltage PIVC/AIVC in response to the logic "high" of the first converted control signal (MODESELB 1), in which an NMOS transistor MN81 is turned on and a resistance R81 is bypassed. Further, the internal power voltage variable circuit, for instance, decreases the level of the internal power voltage PIVC/AIVC in response to the logic "high" of the second converted control signal (MODESELB 2), in which an NMOS transistor MN82 is turned on and a resistance R82 is bypassed.

Figure 9:
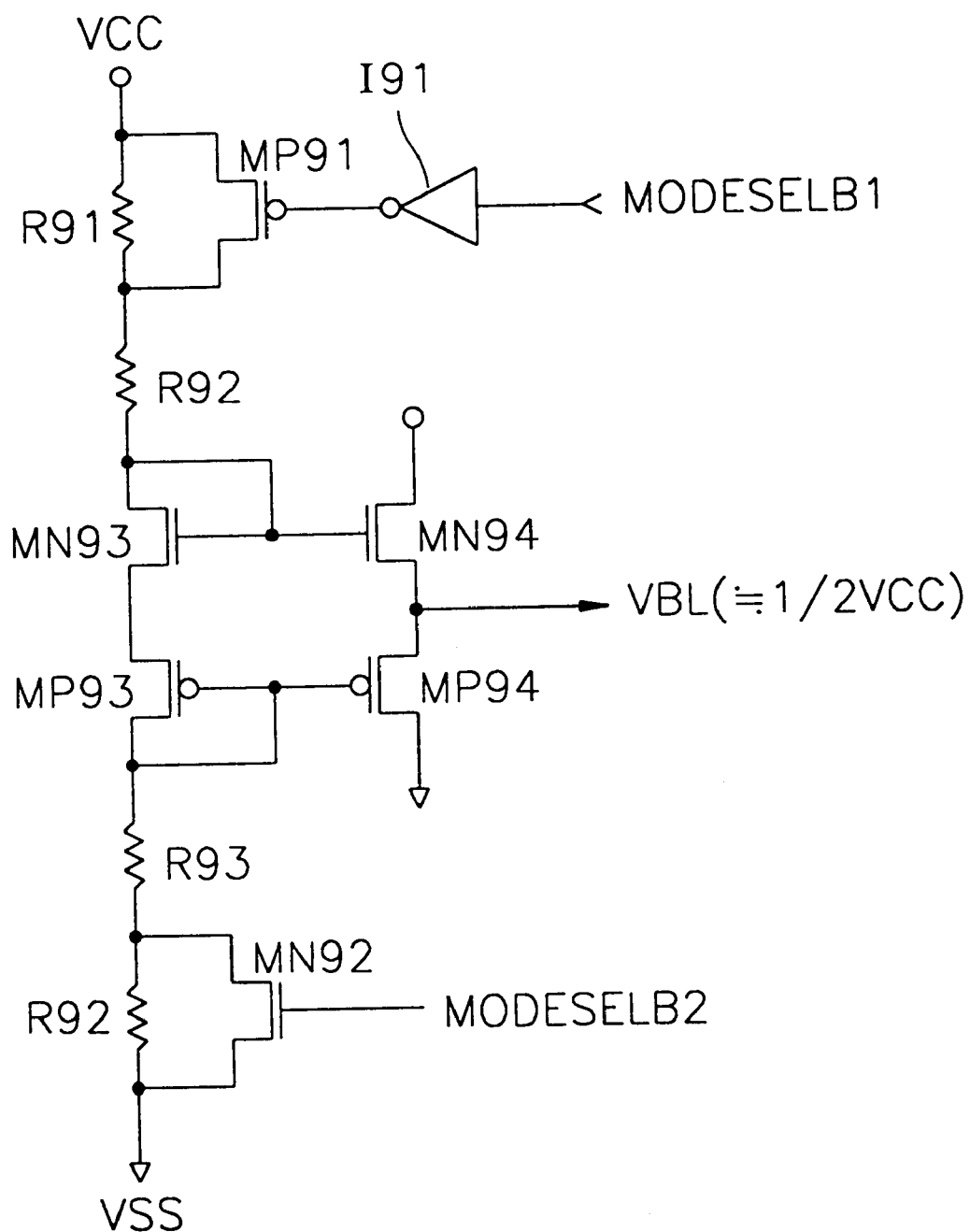
FIG. 9 is a circuit diagram of a ½ power supply voltage generating circuit comprising a control signal generating circuit according to the present invention.

FIG. 9 shows an one half (½) power supply voltage generating circuit comprising a control signal generating circuit according to an embodiment of the present invention. Typically, the one half (½) power supply voltage generating circuit is used for a pre-charging circuit of a bit-line or an electrode of a cell capacitor in a semiconductor memory device.

Referring to FIG. 9, the ½ power supply voltage generating circuit controls a level of an output voltage VBL in response to logic levels of first and second inverted control signals (MODESELB 1 and MODESELB 2) output from the control signal generating circuit 200, 300, 400, or 500. For instance, the ½ power supply voltage generating circuit increases the level of the output voltage VBL in response to the logic "high" of the first inverted control signals (MODESELB 1), in which a PMOS transistor MP91 is turned on and a resistance R91 is bypassed. Further, the ½ power supply voltage generating circuit decreases the level of the output voltage VBL in response to the logic "high" of the second inverted control signals (MODESELB 2), in which a NMOS transistor MN 92 is turned on and a resistance R92 is bypassed.

Figure 10:
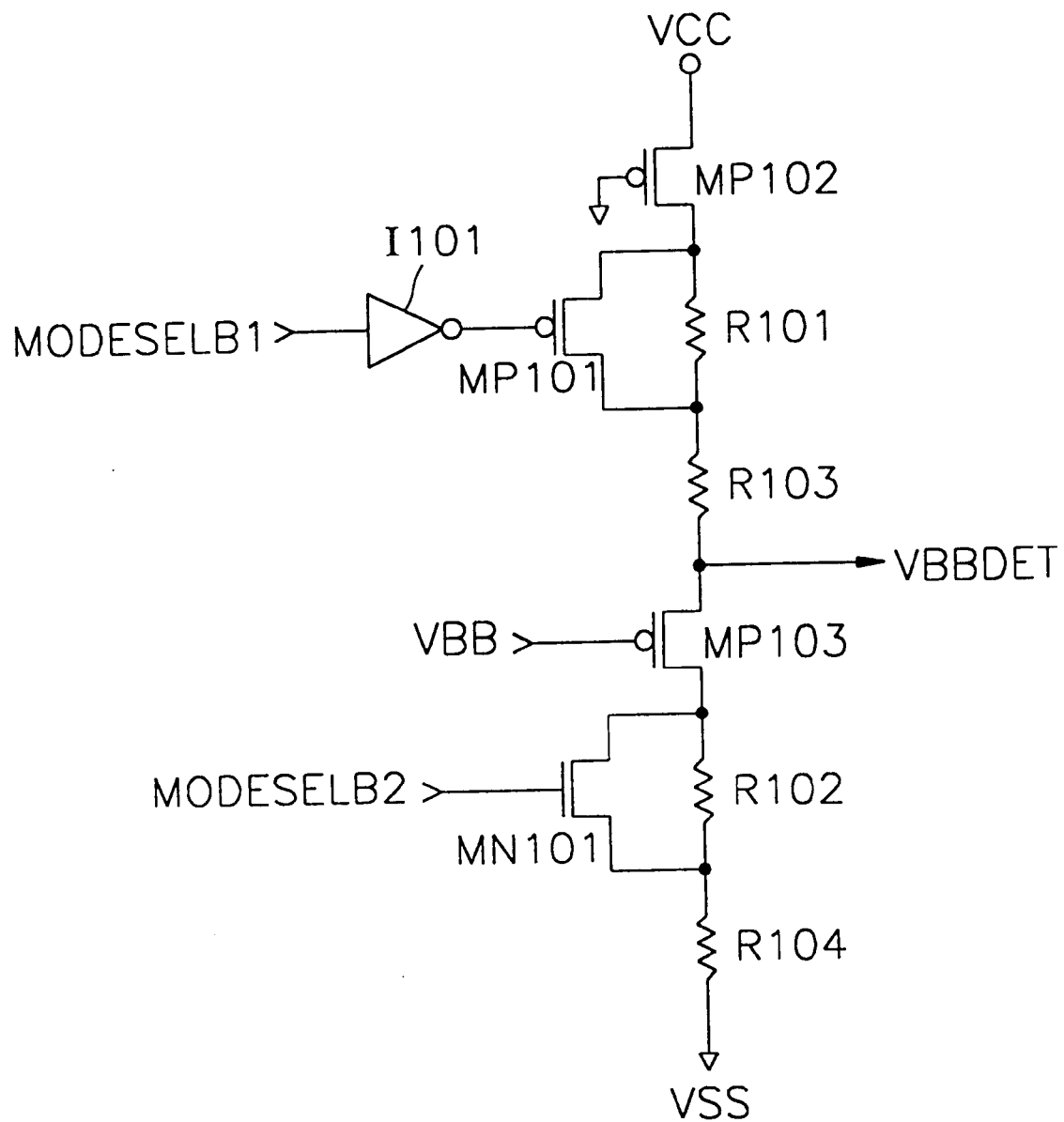
FIG. 10 is a circuit diagram of a negative voltage generating circuit comprising a control signal generating circuit according to the present invention.

FIG. 10 shows a negative voltage generating circuit comprising a control signal generating circuit according to an embodiment of the present invention. The negative voltage generating circuit controls a level of a negative voltage VBBDET in response to logic levels of first and second inverted control signals (MODESELB 1 and MODESELB 2) output from a control signal generating circuit 200, 300, 400, or 500.

For instance, the negative voltage generating circuit increases the level of the negative voltage VBBDET in response to the logic "high" of the first inverted control signals (MODESELB 1), in which a PMOS transistor MP101 is turned on by an inverter I101 and a resistance R101 is bypassed. Further, the negative voltage generating circuit decreases the level of the negative voltage VBBDET in response to the logic "high" of the second inverted control signals (MODESELB 2), in which an NMOS transistor MN101 is turned on and a resistance R102 is bypassed.

Figure 11:
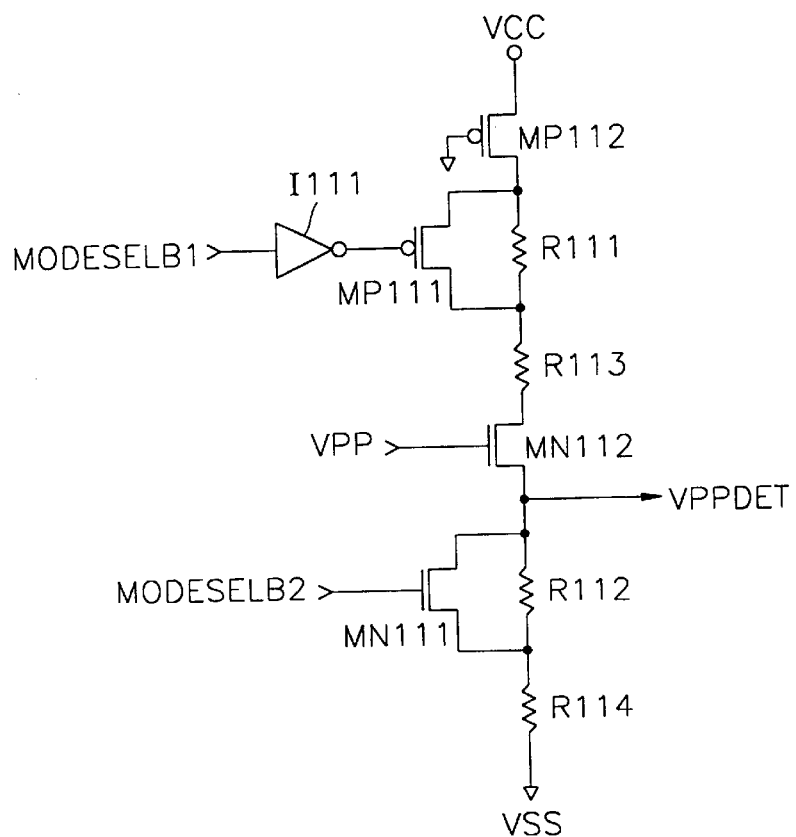
FIG. 11 is a circuit diagram of a booster voltage generating circuit comprising a control signal generating circuit according to the present invention.

FIG. 11 shows a booster voltage generating circuit comprising a control signal generating circuit according to an embodiment of the present invention. The booster voltage generating circuit controls a level of a booster voltage VPPDET in response to logic levels of first and second inverted control signals (MODESELB 1 and MODESELB 2) output from a control signal generating circuit 200, 300, 400, or 500.

For instance, the booster voltage generating circuit decreases the booster voltage VPPDET in response to the logic "high" of the first inverted control signal (MODESELB 1), in which a PMOS transistor MP111 is turned on by a inverter I111 and a resistor R111 is bypassed. Further, the booster voltage generating circuit increases the booster voltage VPPDET in response to the logic "high" of the second inverted control signal (MODESELB 2), in which an NMOS transistor MN111 is turned on and a resistance R112 is bypassed.

Figure 12:
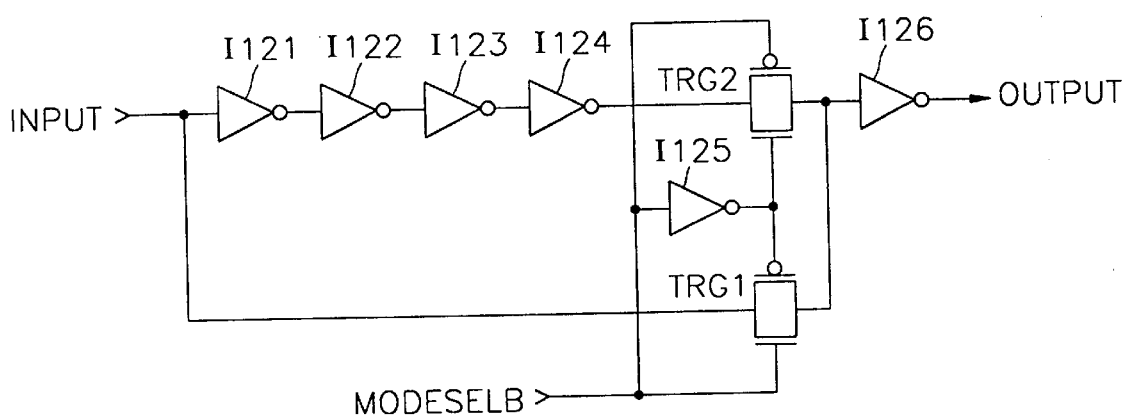
FIG. 12 is a circuit diagram of a variable delay circuit comprising a control signal generating circuit according to the present invention.

FIG. 12 shows a variable delay circuit comprising a control signal generating circuit according to an embodiment of the present invention. The variable delay circuit generates an output signal (OUTPUT) in response to a logic level of an inverted control signal (MODESELB) output from the control signal generating circuit 200, 300, 400, or 500.

For instance, the variable delay circuit turns on a first transmission gate TRG1, thereby outputting an input signal (INPUT) as an output signal (OUTPUT), in response to a logic "high" of the inverted control signal (MODESELB). Further, the variable delay circuit turns on a second transmission gate TRG2 to delay the input signal (INPUT) using inverters I121, I122, I123, and I124, and then output the delayed input signal (INPUT) as the output signal (OUTPUT), in response to a logic "low" of the inverted control signal (MODESELB). At this time, the time for delaying the input signal (INPUT) depends on the number of inverters I121, I122, I123, and I124.

Advantageously, a control signal generating circuit according to an embodiment of the present invention prohibits current from flowing through a make-link type fuse, thereby preventing the cut-off of the make-link type fuse and improving the stability and reliability of the control signal generating circuit. Further, it is possible to simplify the configuration of various circuits by using a make-link type fuse. Moreover, it is possible to realize a fine fuse pitch, thereby increasing the integration degree of semiconductor memory devices.

Although the invention has been described with reference to embodiments shown in the drawings, the drawings are for illustration purposes only. It will be apparent to one of ordinary skill in the art that modifications of the described embodiments may be made without departing from the spirit and scope of the invention. Consequently, the true technical protection of the present invention must be determined based on the technical spirit of the appended claims.

What is claimed is:

1. A circuit for generating a control signal, the circuit comprising: a first transistor for receiving an input signal at a gate thereof, the first transistor being connected to a first voltage;
   a second transistor for receiving the input signal at a gate thereof, the second transistor being connected to a second voltage;
   a make-link type fuse serially linked between the first transistor and the second transistor by application of energy; and
   a sensing circuit, connected to the make-link type fuse, for sensing whether the make-link type fuse is linked or not between the first and second transistors and for outputting a control signal based on the sensed result and the input signal,
   wherein the first transistor and the second transistor are complementarily connected to turn one of the first and second transistors in response to the input signal, thereby preventing current from flowing between the first and second transistors when the make-link type fuse is linked between the first transistor and the second transistor,
   wherein the sensing circuit comprises: a first inverter connected to a node connecting to the make-link type fuse: a third transistor having a gate, a first end, and a second end, wherein the gate receives an output signal of the first inverter, the first end is connected to the node and the second end is connected to the first voltage; and a second inverter connected to the first inverter, for outputting the control signal,
   wherein the first transistor and the third transistor are PMOS transistors, and the second transistor is an NMOS transistor.

2. The circuit of claim 1, wherein the first voltage is a power supply voltage and the second voltage is a ground voltage.

3. A circuit for generating a control signal, the circuit comprising:
   a first transistor for receiving an input signal at a gate thereof, the first transistor being connected to a first voltage;
   a current limiter connected to a second voltage;
   a make-link type fuse serially linked between the first transistor and the current limiter by application of energy; and
   a sensing circuit, connected to the make-link type fuse, for sensing whether the make-link type fuse is linked between the first transistor and the current limiter or not and for outputting a control signal based on the sensed result and the input signal.

4. The circuit of claim 3, wherein the sensing circuit comprises:
   a first inverter connected to a node connecting to the make-link type fuse;
   a second transistor having a gate, a first end, and a second end, wherein the gate receives an output signal of the first inverter, the first end is connected to the node and the second end is connected to the first voltage; and
   a second inverter, connected to the first inverter, for outputting the control signal.

5. The circuit of claim 4, wherein the first and second transistors are NMOS transistors.

6. The circuit of claim 5, wherein the first voltage is a ground voltage and the second voltage is a power supply voltage.

7. The circuit of claim 4, wherein the first and second transistors are PMOS transistors.

8. The circuit of claim 7, wherein the first voltage is a power supply voltage and the second voltage is a ground voltage.

9. The circuit of claim 3, wherein the current limiter is a resistor.

10. The circuit of claim 3, wherein the current limiter is a transistor serving as a resistor.

11. A semiconductor device comprising a control signal generating circuit, the control signal generating circuit comprising:

a first transistor for receiving an input signal at a gate thereof, the first transistor being connected to a first voltage;

a current limiter connected to a second voltage;

a make-link type fuse serially linked between the first transistor and the current limiter by application of energy; and a sensing circuit, connected to the make-link type fuse, for sensing whether the make-link type fuse is linked between the first transistor and the current limiter or not and for outputting a control signal based on the sensed result and the input signal, wherein the control signal selects an operation mode of the semiconductor device.

* * * * *